United States Patent

Kim

[11] Patent Number: 5,856,656
[45] Date of Patent: Jan. 5, 1999

[54] ELECTRICAL GROUNDING ARRANGEMENT FOR A PRINTED CIRCUIT BOARD OF A MICROWAVE OVEN

[75] Inventor: Geun-Soo Kim, Seoul, Rep. of Korea

[73] Assignee: Samsung Electronics Co., Ltd., Suwon, Rep. of Korea

[21] Appl. No.: 897,310

[22] Filed: Jul. 21, 1997

[30] Foreign Application Priority Data

Jul. 29, 1996 [KR] Rep. of Korea ............... 1996 22582

[51] Int. Cl.⁶ ..................................................... H05B 6/68
[52] U.S. Cl. .......................... 219/702; 219/723; 219/756; 361/753
[58] Field of Search .................................. 219/702, 723, 219/715, 756; 361/753, 816

[56] References Cited

U.S. PATENT DOCUMENTS

| | | | |
|---|---|---|---|
| 4,823,235 | 4/1989 | Suzuki et al. | 361/816 |
| 5,563,761 | 10/1996 | Apa et al. | 361/119 |
| 5,644,474 | 7/1997 | Jang | 361/753 |

FOREIGN PATENT DOCUMENTS

| | | | |
|---|---|---|---|
| 2-250287 | 10/1990 | Japan | 219/723 |
| 5-205868 | 8/1993 | Japan | 219/723 |
| 8/233286 | 9/1996 | Japan . | |

*Primary Examiner*—Philip H. Leung
*Attorney, Agent, or Firm*—Burns, Doane, Swecker & Mathis, L.L.P.

[57] ABSTRACT

The present invention relates to a ground structure of a printed circuit board in a microwave oven, where the microwave oven formed with a screw hole at a tip end of a bar extended from a body thereof and having a jumper wire connected to a ground pattern at around a screw hole formed at a printed circuit board while a bolt is screwed to a control panel through a screw hole formed at the tip end of the bar and through a screw hole formed at the printed circuit board are connected by the jumper wire, so that the printed circuit board is automatically connected and grounded to the body of the microwave oven when the printed circuit board is fastened to the control panel, thereby providing a convenience in assembly of the microwave oven and a stability thereto.

1 Claim, 2 Drawing Sheets

ELECTRICAL GROUNDING ARRANGEMENT FOR A PRINTED CIRCUIT BOARD OF A MICROWAVE OVEN

BACKGROUND OF THE INVENTION

1. Field of the Invention

The present invention relates to a microwave oven, and more particularly to a microwave oven for automatically grounding a printed circuit board to a body of a microwave oven when the printed circuit board is fastened to a control panel.

2. Description of the Prior Art

Generally, a microwave oven is designed to generate microwaves to heat and cook the food, where the microwave oven is disposed at a body thereof with a control panel equipped with a manipulating key.

The printed circuit board (hereinafter referred to as PCB) for electrically controlling the microwave oven according to a signal input through the manipulating key is fastened and fixed to an inner side of the control panel.

In the conventional microwave oven thus constructed and illustrated in FIG. 1, the PCB 1 is secured to a plastic control panel 3 by way of a plurality of screws (2-1, 2-2, 2-3 and 2-4).

At this location, a ground pattern formed at the PCB 1 and a body 4 of the microwave oven made of steel are connected by a ground wire 5 to thereby ground the PCB 1 to the body 4 of the microwave oven.

However, there is a problem in a ground structure of a PCB according to the prior art thus constructed, in that a separate ground wire 5 must be pulled out of the PCB 1 to be connected to the body 4, which leads to inconveniences in assembly of the microwave oven.

Furthermore, there is another problem in that an operator often forgets to connect the ground wire 5 to the body 4 of the microwave oven to thereby cause a safety problem because the PCB 1 is not grounded to the body 4.

Meanwhile, an example of a microwave oven disclosed in Japanese Patent Application Laid-Open Publication No. Hei-8-233286 has a construction where a PCB is screwed to an inner side of a panel disposed with a manipulating key, so that a screw fastening member cannot be forgotten in fastening.

In the microwave oven thus constructed as illustrated in FIG. 2, the PCB is formed with a screw hole through which the PCB is fastened via a fastening screw to an inner side of the panel disposed with a manipulating key.

At this time, the PCB is formed with a screw hole which in turn renders same unconductive, but the PCB is rendered conductive by way of the screw being plugged into the screw hole.

Accordingly, a microcomputer 10 connected to the PCB can discriminate whether or not a screw is inserted thereinto according to a potential of the PCB.

The conventional microwave oven thus constructed can only discriminate whether or not a screw for fixing the PCB to a control panel is accurately fastened.

SUMMARY OF THE INVENTION

The present invention is presented to solve the aforementioned problem and it is an object of the present invention to provide a microwave oven capable of automatically connecting a PCB to a body of a microwave oven to thereafter be grounded when the PCB is screwed and fixed to a control panel.

In accordance with the object of the present invention, there is provided a microwave oven, the microwave oven formed with a screw hole at a tip end of a bar extended from a body thereof and having a jumper wire connected to a ground pattern at around a screw hole formed at a printed circuit board while a bolt is screwed to a control panel through a screw hole formed at the tip end of the bar and through a screw hole formed at the printed circuit board are connected by the jumper wire, so that the printed circuit board is automatically connected and grounded to the body of the microwave oven when the printed circuit board is fastened to the control panel.

BRIEF DESCRIPTION OF THE DRAWINGS

For fuller understanding of the nature and objects of the invention, reference should be made to the following detailed description taken in conjunction with the accompanying drawings in which.

DETAILED DESCRIPTION OF THE INVENTION

The present invention will now be described in detail with reference to the accompanying drawings.

Figure 1:
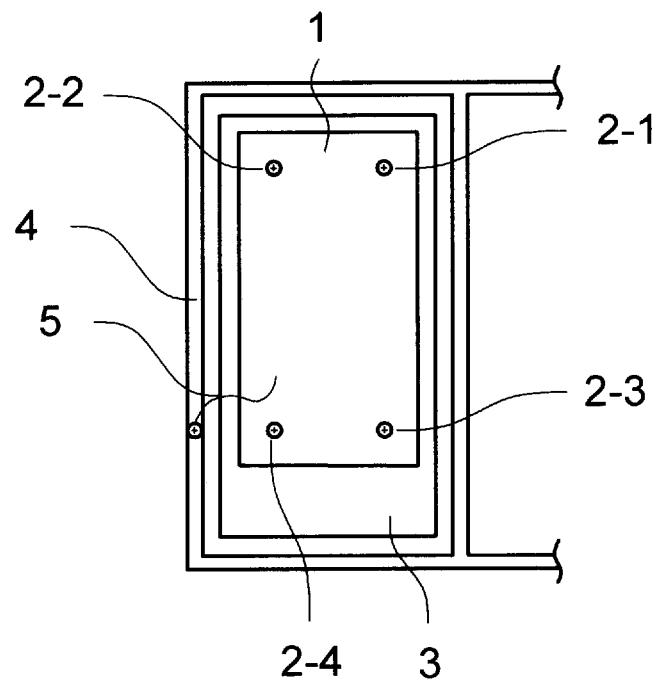
FIG. 1 is a schematic diagram for illustrating a ground structure of a printed circuit board of a microwave oven according to one embodiment of the prior art.
Figure 2:
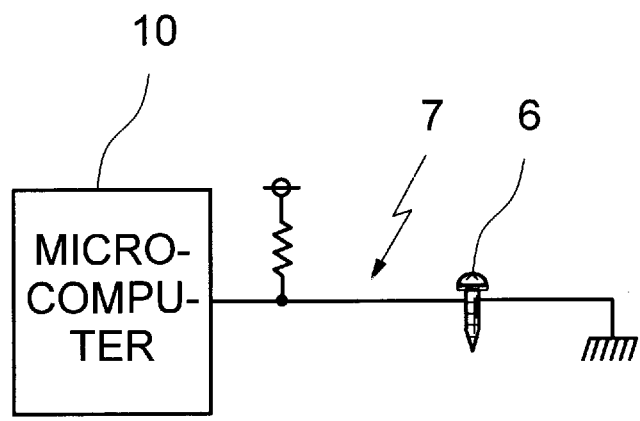
FIG. 2 is a circuit diagram for illustrating a screw detecting circuit of a microwave oven according to another embodiment of the prior art.
Figure 3:
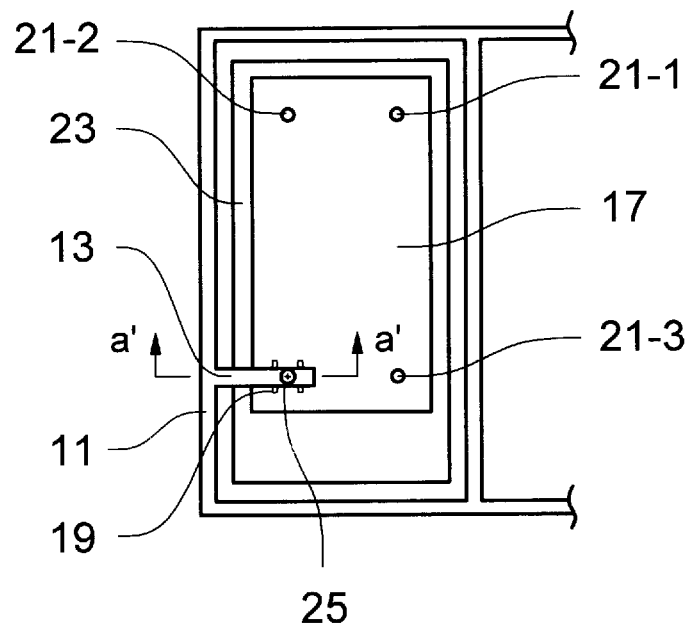
FIG. 3 is a schematic diagram for illustrating a ground structure of a printed circuit board in a microwave oven according to the present invention.
Figure 4:
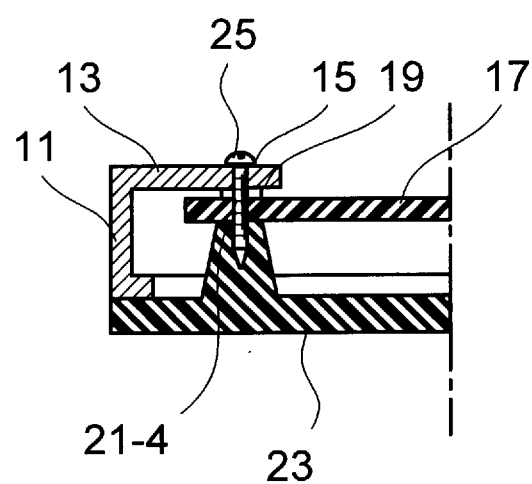
FIG. 4 is a sectional view taken along line a–a' in FIG. 3.

FIG. 3 is a schematic diagram for illustrating a ground structure of a printed circuit board in a microwave oven according to the present invention and FIG. 4 is a sectional view taken along line a–a' in FIG. 3, where, a bar 13 extended from a body 11 of the steel-made microwave oven is formed and a screw hole 15 is formed at a tip end of the bar 13, while, a printed circuit board 17 (hereinafter referred to as PCB) is formed with a plurality of screw holes (21-1, 21-2, 21-3 and 21-4) and a jumper wire 19 connected to a ground pattern is secured around one of the plurality of screw holes (21-1, 21-2, 21-3 and 21-4).

Furthermore, a bolt 25 is screwed to a control panel 23 through the screw hole 15 formed at the tip end of the bar 13 and through a screw hole 21-4 formed at the PCB 17 while the bar 25 and the PCB 17 are connected by the jumper wire so that the PCB 17 is automatically connected and grounded to the body 11 of the microwave oven when the PCB 17 is fastened to the control panel 23.

Now, operational effect of the microwave oven thus constructed will be described in detail.

The bolt 25 is screwed to the screw hole 15 formed at the tip end of the bar 13 extended from the body 11 of the steel-made microwave oven, and then the bolt 25 is screwed to the screw hole 21-1 formed at the PCB 17 with the jumper wire 19 formed at the PCB 17 lying therebetween, wherely the bolt 25 is inserted into the screw hole 21-1 formed at the PCB 17 to thereby be screwed into the control panel 23 of plastic material.

When the PCB 17 is fixed to the control panel 23, the jumper wire 19 connected to the ground pattern of the PCB 17 contacts the bar 13 extended from the body 11 of the microwave oven.

Successively, the PCB 17 is grounded to the body 11 of the microwave oven via the jumper wire 19 and the bar 13.

As apparent from the foregoing, there is an advantage in the microwave oven according to the present invention, in that a PCB is automatically grounded to a body of a microwave oven when the PCB is fastened to a control panel to thereby provide a convenience in assembly of the microwave oven and a stability to the microwave oven.

What is claimed is:

1. A microwave oven comprising a body, a non-metallic control panel mounted on the body, and a printed circuit board attached to the control panel; the printed circuit board including a first hole and a ground pattern extending around the first hole, a jumper wire on an upper surface of the printed circuit board and disposed in electrically conducting engagement with the ground pattern, the body including a metallic bar extending across a portion of the printed circuit board containing the jumper wire and including a second hole; a fastening screw extending through the first and second holes within an area bordered by the jumper wire and connected to the control panel for attaching the circuit board to the control panel, and simultaneously pressing the bar into direct engagement with the jumper wire to electrically ground the ground pattern to the body.

* * * * *